United States Patent [19]
Tada et al.

[11] Patent Number: 5,647,999
[45] Date of Patent: Jul. 15, 1997

[54] METHOD FOR FINE PATTERNING OF A POLYMERIC FILM

[75] Inventors: Tetsuya Tada, Tsukuba; Toshihiko Kanayama, Tsuchiura, both of Japan

[73] Assignee: Japan as represented by Director General of Agency of Industrial Science and Technology, Tokyo, Japan

[21] Appl. No.: 618,606

[22] Filed: Mar. 20, 1996

[30] Foreign Application Priority Data

May 15, 1995 [JP] Japan .................................. 7-115531

[51] Int. Cl.$^6$ .................... B44C 1/22; H01L 21/00
[52] U.S. Cl. ................... 216/49; 156/643.1; 156/659.11; 216/43; 216/67
[58] Field of Search ................ 156/643.1, 657.1, 156/633.1, 659.11, 662.1, 656.1; 216/2, 33, 35, 43, 49, 67

[56] References Cited

U.S. PATENT DOCUMENTS 5,198,073  3/1993  Ishibashi ................... 216/49
5,275,689  1/1994  Felten et al. ............... 216/49 X Primary Examiner—William Powell
Attorney, Agent, or Firm—Wenderoth, Lind & Ponack

[57] ABSTRACT

A unique method is proposed for fine patterning of a polymeric resin film on a substrate surface or fine patterning of the substrate surface with the patterned resin film as the resist. The method comprises the steps of: (a) forming a thin film of the resin on the substrate surface; (b) pressing the resin film pattern-wise under a pressure in a specified range by using, for example, a fine needle tip so as to enhance adhesion of the resin molecules to the substrate surface; and (c) dissolving away the resin film with an organic solvent selectively in the areas where the pressure is not applied in step (c) leaving the resin in a pattern-wise area after application of the pressure. The fineness of this patterning can be extremely high to be in the molecular size order.

12 Claims, 3 Drawing Sheets

5,647,999

METHOD FOR FINE PATTERNING OF A POLYMERIC FILM

BACKGROUND OF THE INVENTION

The present invention relates to a method for fine patterning of a polymeric film in a novel procedure not known in the prior art to obtain a patterned polymeric film which can serve as an etching resist in an etching treatment of a substrate surface.

As is well known, the manufacturing process of various kinds of electronic parts including semiconductor devices, e.g., ICs and LSIs, involves a step of fine patterning of the substrate surface which is performed by the photolithography, electron-beam lithography, X-ray lithography and the like. Each of these lithographic methods utilizing actinic rays as the patterning means has its own disadvantages and limitations. For example, the photolithographic method has an inherent limitation in principle that the fineness of the pattern formed thereby can hardly be finer than a half of the wavelength of the light, e.g., ultraviolet light, used for pattern-wise irradiation of the resist layer. In the X-ray lithography, pattern resolution in the order of 10 nm has not yet been accomplished because the fineness of an X-ray mask for patterning currently available is not so high. Pattern resolution of 10 nm order cannot be obtained also in the electron-beam lithography due to the limitation in the resolving performance of the resist material per se or due to the influences of scattering of the secondary electrons. In addition, there is a problem that the method is considerably time-consuming because the method is performed by scanning of an electron beam in accordance with the desired pattern. This problem is particularly serious when a patterned resist layer including a large number of fine structures of the nanometer range, such as a large number of quantum dots.

SUMMARY OF THE INVENTION

The present invention accordingly has an object, in view of the above described problems and limitations in the prior art method for patterning, to provide a novel and efficient method for patterning of a polymeric film to form an extremely finely patterned film in an order of 10 nm, which can be used as an etching mask for fine working on a substrate surface by etching.

Thus, the method of the invention for patterning of a polymeric film comprises the steps (a) forming, on the surface of a substrate, a thin film of an organic polymeric resin soluble in an organic solvent;

(b) applying a pressure pattern-wise to the film of the organic polymeric resin on the substrate surface so as to insolubilize the organic polymeric resin or to enhance adhesion of the organic polymeric resin to the substrate surface on the pattern-wise areas having been subjected to the application of pressure; and (c) selectively dissolving away, with an organic solvent, the organic polymeric resin of the film in the areas without application of pressure in step (b).

In particular, the organic polymeric resin is a polymer or copolymer of a monomer or mixture of monomers selected from olefins, aromatic vinyl compounds, (meth) acrylic acid and esters of (meth) acrylic acid. The pressure to be applied to the film of the organic polymeric resin is preferably in the range from 0.01 GPa to 30 GPa.

DETAILED DESCRIPTION OF THE PREFERRED EMBODIMENTS

Figure 1A:
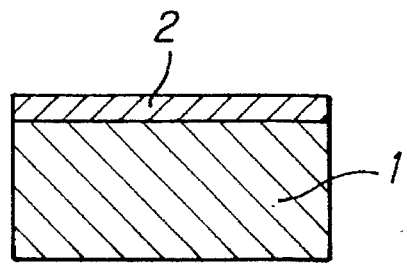
FIGS. 1A to 1C are each a schematic illustration of one of the process steps for patterning according to the inventive method in an embodiment by pressing and FIG. 1D is a partial conceptional enlargement of FIG. 1C.

As is described above, the principle of the inventive method is very unique and novel based on the discovery that certain polymeric resins can be insolubilized or adhesion thereof to the substrate surface is increased against the attack of an organic solvent when a thin film of the resin is subjected to the application of a pressure. The above mentioned discovery has been obtained as a result of the extensive investigations undertaken by the inventors with an object to develop a novel means for patterning of a polymeric resin film which is quite different from and hence free from the disadvantages and limitations in the prior art patterning methods. It has been established that, accordingly, when a thin film of an organic polymeric resin on a substrate surface is subjected to a pattern-wise pressing treatment and then immersed in an organic solvent which is a good solvent for the resin per se, some of molecules of the resin film in the pressed areas are left undissolved in the solvent. Consequently, the resin film is patterned on the substrate surface and the fineness can be as fine as to be in the 10 nm order leading to completion of the present invention.

The material of the substrate, on which a thin film of an organic polymeric resin is formed in step (a) of the inventive method, is not particularly limitative and can be any of the materials conventionally used in the fields of electronic industries, printing technologies, precision machining and so on including metals, alloys, ceramics, semiconductor materials and the like. Particular examples of the substrate material include aluminum, tungsten, titanium, nickel, cobalt, iron, silicon, alloys of these elements, silicon nitride, gallium arsenide, titanium dioxide, silicon dioxide, glass and the like. The inventive method is applicable particularly satisfactorily to semiconductor silicon wafers.

The organic polymeric resin, of which a thin film is formed on the surface of a substrate mentioned above, must be soluble in an organic solvent and, though not particularly limitative, is selected from those exhibiting good adhesion to the substrate surface. It is desirable that, when a thin film of the resin receives a pressure, an increase is caused in the molecular weight or density of the polymeric resin so as to lose or decrease the solubility in organic solvents or to increase the adhesion to the substrate surface to be less easily removable with an organic solvent.

Particular examples of the organic polymeric resins suitable for use in the inventive method include homopolymers and copolymers of one or more of ethylenically unsaturated monomeric compounds consisting of the monomeric units expressed by the formula —($CH_2$—$CR^1R^2$)—, in which $R^1$ and $R^2$ are each an atom or group of —H, —$CH_3$, —$C_6H_5$, —COOH, —$COOCH_3$, —$COONH_2$ or —$COCH_3$, though not limitative thereto. Examples of suitable monomeric compounds therefor include: olefins such as ethylene and propylene; aromatic vinyl compounds such as styrene and α-methyl styrene; unsaturated carboxylic acids such as acrylic acid, methacrylic acid, cinnamic acid, 2-acetyl acrylic acid, maleic acid and fumaric acid; functional derivatives of unsaturated carboxylic acid exemplified by esters of unsaturated carboxylic acid such as methyl acrylate, ethyl acrylate, propyl acrylate, methyl methacrylate, ethyl methacrylate and propyl methacrylate, amides of unsaturated carboxylic acid such as acrylamide, methacrylamide, 2-phenyl acrylamide and 2-acetyl acrylamide and anhydrides of unsaturated carboxylic acid such as maleic anhydride; vinyl acetate; vinyl chloride; vinylidene chloride; acrylonitrile; methacrylonitrile and so on, of which particularly suitable in the inventive method are polymers of a (meth) acrylic acid ester such as poly(ethyl acrylate), poly (methyl methacrylate) and the like and polymers of an aliphatic or aromatic unsaturated hydrocarbon compound such as polypropylene, polystyrene and the like. Poly (methyl methacrylate) and polystyrene are the most preferable.

It is preferable that the above mentioned organic polymeric resin has a weight-average molecular weight in the range from 1,000 to 2,000,000 or, more preferably, from 10,000 to 600,000.

A thin film of the above described organic polymeric resin can be formed on the surface of a substrate by a so-called coating method, in which the resin is dissolved in an organic solvent and the solution is uniformly applied to the substrate surface using a suitable coating machine such as spinners followed by evaporation of the solvent to leave a dried film of the resin having a thickness, usually, in the range from 10 to 100 nm.

In the next place, a pressure is applied pattern-wise to the thus formed thin film of the polymeric resin tracing a desired pattern so that the adhesion between the resin film or resin molecules and the substrate surface is remarkably increased in the areas to which the pressure has been applied to cause insolubilization or decrease of the solubility of the resin film in an organic solvent. And, when the resin film on the substrate surface is immersed in an organic solvent, the resin film in the areas without influences of the pressure application is selectively dissolved away in the solvent leaving molecules of the resin film in the pressure-applied areas undissolved by firmly adhering to the substrate surface to form a patterned resin film on the substrate surface.

The distribution density of the polymer molecules adhering to the substrate surface is increased as the applied pressure is increased and, when the pressure is not excessively high, the individual polymer molecules discretely adhere to the substrate surface so that it is a possible way to obtain a patterned resin film with fineness of molecular size by adequately controlling the pressure. Even when a pressure is applied evenly over a certain area of the substrate surface, for example, by utilizing a hydrostatic pressure, accordingly, an extremely fine pattern having evenly distributed dots of the molecular size can be formed from a thin film of the polymeric resin. When the pressure is applied to the resin film along the contour of a desired pattern, adhesion of the polymer molecules to the substrate surface occurs only in the pressure-applied areas to give a pattern consisting of fine dots, each having the size of the polymer molecules, which are distributed in a density corresponding to the applied pressure. The size of each dot can be controlled accordingly by adequately selecting the dimensions of the polymer molecules or the molecular weight thereof. It is of course that, when the pressure applied is sufficiently high, the pressure-applied areas are filled up with the polymer molecules in such a density as to leave no open spaces between the polymer molecules to give a complete pattern of the resin film. It is also possible to conduct concurrent patterning of a plurality of patterns by adopting an appropriate patterning means so that the throughput of the patterning process can be increased so much.

Figure 1B:
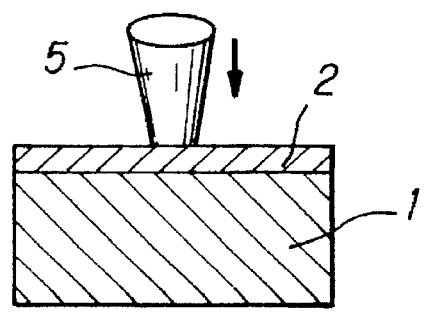
Figure 1C:
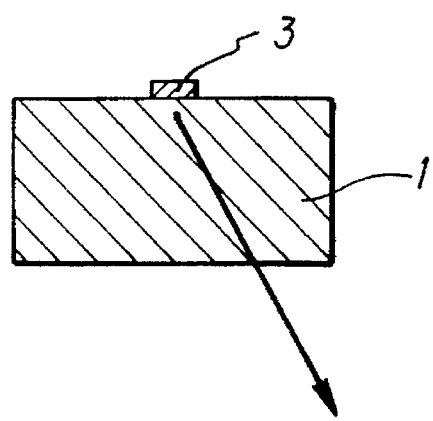
Figure 1D:

FIGS. 1A to 1C of the accompanying drawing are each a schematic illustration of one of the steps in an embodiment for practicing the method of the invention by a cross sectional view, according to which a thin film 2 of an organic polymeric resin is formed on the surface of a substrate 1 in step (a) and then a pressure is applied to the resin film 2 with an appropriate presser head 5 in the form of a truncated cone in step (b) followed by the treatment with an organic solvent. And, the resin film 2 on the areas without application of the pressure is removed by dissolving away in the solvent leaving molecules of the pattern-wise resin film 3 in the pressure-applied area alone in step (c). FIG. 1D is a conceptional enlargement of the patterned resin film 3 obtained in step (c), each small circle representing a polymer molecule.

The organic solvent used for dissolving away the resin film from the pattern-wise areas without application of the pressure is not particularly limitative provided that the polymeric resin can be dissolved in the solvent. For example, acetone, methyl ethyl ketone and diethyl ketone as well as mixtures thereof can be used when the organic polymeric resin is poly(methyl methacrylate) and aromatic hydrocarbon solvents such as toluene can be used when the resin is polystyrene. When the resin film after pattern-wise application of a pressure on the substrate surface is immersed in these organic solvents, the resin film in the part where pressure is not applied is selectively dissolved away.

As is mentioned above, pattern-wise application of a pressure to the thin film of a polymeric resin in the inventive method can be performed simply by using a needle and pressing it at the desired position against the resin film on the substrate surface. In addition to this method, pressure application in a stripe pattern can be performed by scratching the resin film on the substrate surface with a needle. The distribution density of the polymer molecules adhering to the substrate surface in this step is increased as the scratching pressure is increased. Needless to say, an excessively large scratching pressure may damage the substrate surface per se or the pressing action against the resin film may be exceeded by the scraping action to cause falling of the resin film so that the distribution density of the adhering polymer molecules is rather decreased. The appropriate range of the applied pressure naturally depends on various factors such as the kind of the polymeric resin, thickness of the resin film, material of the substrate, microscopic profile of the needle tip and so on but, to give an example, a pressure in the range from 0.01 GPa to 30 GPa or, preferably, from 1 GPa to 20 GPa is appropriate when a thin film of a poly(methyl methacrylate) resin formed on the surface of a semiconductor silicon single crystal wafer is scratched with a diamond needle having a tip diameter of 12 µm.

Although the respective microscopic positions of the dots formed by the polymer molecules are out of control in the needle-scratching method mentioned above, the method is sufficient for controlling the macroscopic positions thereof and the distribution density of the dots can also be controlled thereby. Accordingly, this method is quite satisfactory when a pattern consisting of a great number of such dots is desired without requiring exact microscopic positioning of the dots within the areas of the pattern.

When exact control of the microscopic positions of the dots is essential, it is possible to obtain such a pattern with exactly controlled microscopic positions of the dots by the application of a pressure to the resin film at the specified area with a needle having a microscopic tip. For example, the tip of a needle can be formed to have a specific pattern of protrusions And cavities so that, when such a needle is pressed against the resin film, the pattern is transferred to the resin film. A needle having such a patterned tip can be used when parallel arrays of dots are desired by a single scratching movement on a resin film with a needle having a patterned tip giving dot arrays in a number corresponding to the number of the protrusions in the patterned tip. A pattern consisting of a plural number of parallel lines can be obtained by using such a needle with which the resin film is scratched under a pressure large enough to cause integration of the dots into a line.

Figure 2A:
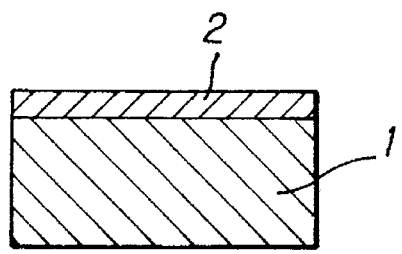
FIGS. 2A to 2C are each a schematic illustration of one of the process steps for patterning according to the inventive method in another embodiment by scratching and FIG. 2D is a partial conceptional enlargement of FIG. 2C.
Figure 2B:
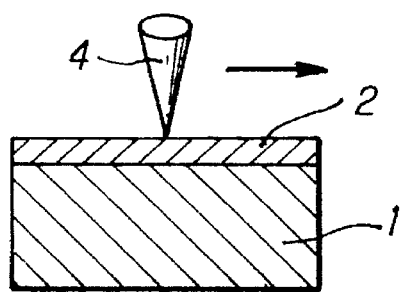
Figure 2C:
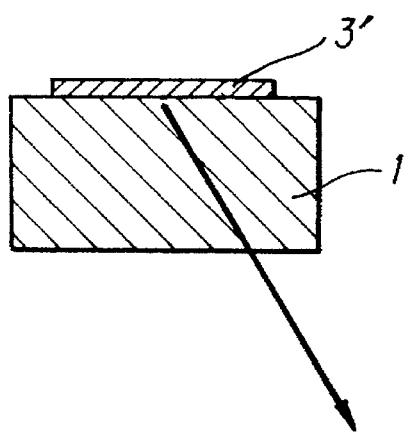
Figure 2D:
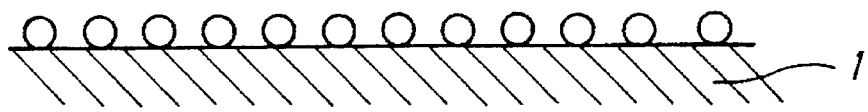

FIGS. 2A to 2C are each a schematic illustration of one of the steps to practice the inventive method in a different embodiment by a cross sectional view, in which a thin film 2 of a polymeric resin is formed on the surface of a substrate 1 in step (a), which is scratched in step (b) with a needle 4 followed by a treatment with an organic solvent in step (c) to leave molecules of the resin film on the areas scratched with the needle tip to form a line pattern 3'. FIG. 2D is a conceptional enlargement of the line pattern 3' in FIG. 2C, each small circle representing a polymer molecule.

The finely patterned resin film on the substrate surface obtained in the above described manner serves as an etching resist when fine patterning is desired in the substrate by an etching treatment. The etching treatment in this case is performed preferably in a dry-etching process using, in particular, an etching apparatus of the electron-cyclotron resonance (ECR) type. This etching method is suitable for extremely fine patterning of a resin film with molecular size fineness as an etching resist so that, by means of the control in the molecular weight of the polymeric resin, a fine precision pattern of the substrate surface with exactly controlled fineness can be obtained.

In conducting the dry-etching process in the above described manner, the resin film per se serves as a resist to protect the substrate surface against attack of the plasma and, in addition, the reactive gas per se or a reaction product of the reactive gas and the substrate surface may be accumulated around the patterned resin film to form a condensate which serves as a protecting mask to protect the substrate surface against the attack of the plasma. These mechanisms are involved in the dry-etching treatment according to the invention in which the patterned resin film serves as a protective mask of molecular-order fineness of 10 nm or even finer.

In the following, the method of the invention is described in more detail by way of examples, which, however, never limit the scope of the invention in any way.

Example 1.

A thin film having a thickness of 75 nm was formed on the surface of a semiconductor single crystal silicon wafer by using a spinner from a poly(methyl methacrylate) resin having a weight-average molecular weight of about 600,000 with a dispersion of about 3. The thus formed resin film was scratched with a stainless steel needle having a flat end of 12 μm diameter under a force of 20 g. Thereafter, the silicon wafer bearing the resin film was immersed in acetone for 2 minutes at 20° C.

The silicon wafer bearing the thus patterned resin film was set in an ECR type etching chamber and subjected to dry etching with the polymer molecules adhering to the substrate surface as a resist. The etching treatment was performed for 1 minute at −130° C. of the substrate temperature in an atmosphere of sulfur hexafluoride as the etching gas under a pressure of 1×10⁻⁴ Torr. The power of microwave at a frequency of 2.45 GHz was 250 watts and a rf power of 5 watts at a frequency of 13.56 MHz was applied to the silicon wafer.

Figure 3:
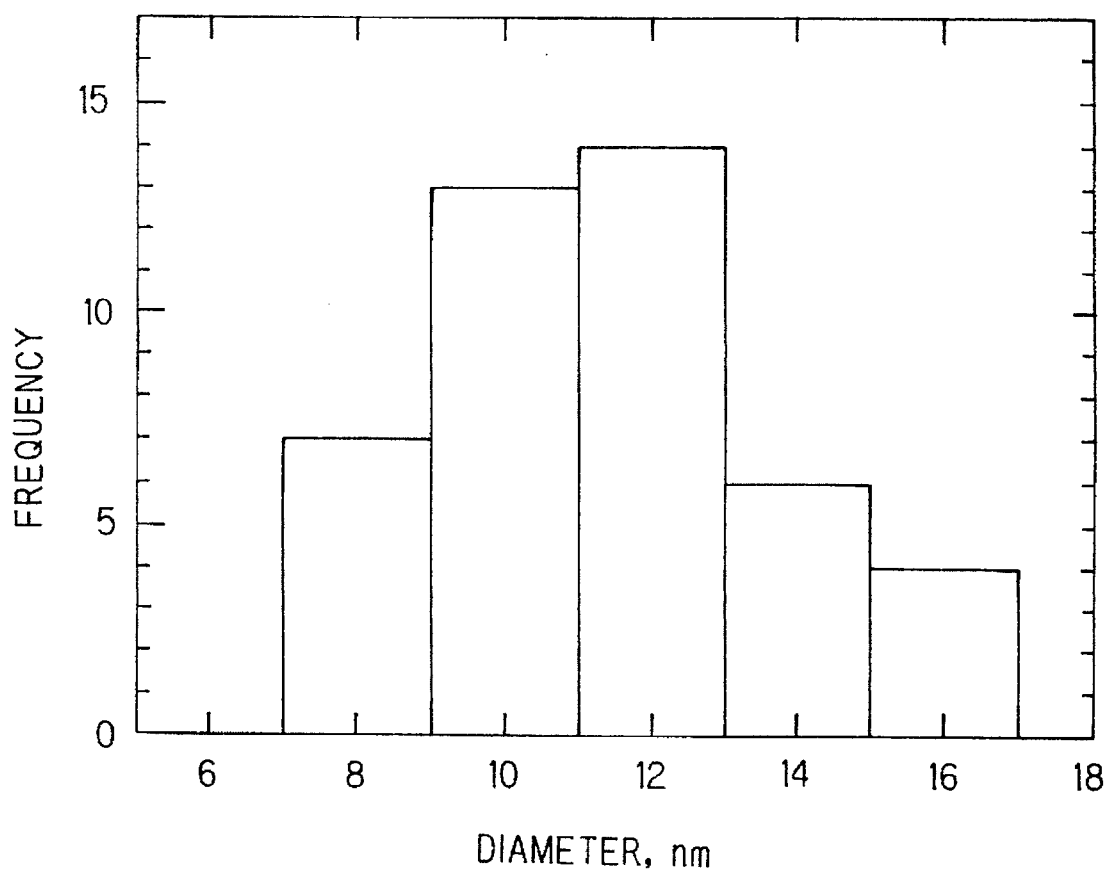
FIG. 3 is a histogram showing the distribution of the diameters of the silicon columns formed in Example 1.

As a result of this etching treatment, columns of silicon having a diameter up to 20 nm were formed on the surface of the silicon wafer along a stripe of about 5 μm width. FIG. 3 is a histogram showing the distribution of the column diameters which distributed in the range from 7 nm to 17 nm with an average value of 11 nm and a standard deviation of 2.5 nm. This distribution of the silicon column diameters was consistent with the molecular weight distribution of the poly(methyl methacrylate) resin used for the resin film. This fact was suggestive of the conclusion that the individual polymer molecules played a role each as an etching mask against the attack of the etching gas plasma.

Example 2.

The experimental procedure was substantially the same as in Example 1 except that the scratching work was conducted with a diamond needle having a tip of 12 μm diameter under a varied force.

As a result of the etching treatment, columns of silicon having a diameter of around 10 nm were formed in a stripe of about 4 μm width when the applied force was 12 g or larger with an increase in the distribution density of the silicon columns as the force was increased.

Example 3.

The experimental procedure was substantially the same as in Example 1 except that the scratching work was conducted with a tungsten needle having a tip of 50 μm diameter under a force of 60 g.

Since the tip surface of the tungsten needle was not perfectly smooth but was rugged with fine protrusions which served each as a finer microneedle, the result of the etching treatment was that the pattern formed on the silicon surface by a single scratching work consisted of several fine lines, each of which in turn consisted of a linear arrangement of microscopic columns having diameters of around 10 nm, distributing within a stripe of about 10 μm width.

Example 4.

A thin film of poly(methyl methacrylate) having a thickness of 75 nm was formed on the surface of a silicon wafer in substantially the same manner as in Example 1. The resin film was pressed with a tungsten needle having a tip of 50 μm diameter under a force of 100 g followed by immersion of the silicon wafer for 2 minutes in acetone.

The thus obtained silicon wafer having the patterned polymeric resin film was subjected to the dry etching treatment for 1 minute in the same manner as in Example 1 to find columns of silicon having a diameter of about 10 nm formed on the silicon surface. The positions of the formed columns corresponded to the protrusions on the tip of the tungsten needle and distributed within a circular area of about 10 μm diameter.

Example 5.

The experimental procedure was substantially the same as in Example 1 except that the scratching work was conducted with a probe of an atomic force microscope (AFM) having a tip of 20 nm diameter under a pressure of about 10 GPa.

As a result of the dry etching treatment conducted in the same manner as in Example 1, a line pattern having a width of 10 nm was found on the silicon surface in the specified location.

Example 6.

The experimental procedure was substantially the same as in Example 5 except that, in place of the scratching work with the AFM probe, the polymeric resin film on the silicon surface was pressed with the AFM probe point by point under a pressure of about 10 GPa along a line. Then the substrate was immersed in acetone for 2 minutes.

As a result of the dry etching treatment conducted in the same manner as in Example 1, an array of dots of silicon having a diameter of about 10 nm was found on the silicon surface in the specified location.

Example 7.

The experimental procedure was substantially the same as in Example 6 except that the point-by-point pressing work was conducted by using another AFM probe having a two-fold split tip under a pressure of about 10 GPa.

As a result of the dry etching treatment conducted in the same manner as in Example 1, two parallel arrays each consisting of dots of silicon having a diameter of about 10 nm were found on the silicon surface in the specified location.

Example 8.

The experimental procedure was substantially the same as in Example 2 except that a polymeric resin film having a thickness of 50 nm was formed on the surface of a silicon wafer from a polystyrene having a weight-average molecular weight of 600,000 with a dispersion of about 3. The resin film was scratched with a diamond needle having a tip of 12 µm diameter under a force of 15 g followed by immersion of the silicon wafer in toluene for 2 minutes.

As a result of the dry etching treatment undertaken in the same manner as in Example 1, columns of silicon having a diameter of about 10 nm were found on the silicon surface.

Example 9.

The experimental procedure for the scratching work and the development treatment with acetone was substantially the same as in Example 3 except that the film of the poly(methyl methacrylate) was formed not on the fresh surface of a silicon wafer but on the thermally oxidized film of $SiO_2$ having a thickness of 100 nm formed in advance on the surface of the silicon wafer. The scratching work of the polymeric resin film was conducted with a tungsten needle having a tip of 50 µm diameter under a force of 60 g followed by immersion of the silicon wafer in acetone for 2 minutes.

The surface of the silicon wafer after the above described treatment was examined with an AFM to find dots of about 10 nm diameter along the scratch line, each of which was supposedly a molecule of the polymer adhering to the substrate surface.

Example 10.

The experimental procedure for the scratching work and the development treatment with acetone was substantially the same as in Example 3 except that the film of the poly(methyl methacrylate) was formed not on the fresh surface of a silicon wafer but on the film of tungsten having a thickness of 90 nm formed in advance by vapor deposition on the surface of the silicon wafer. The scratching work of the polymer film was conducted with a tungsten needle having a tip of 50 µm diameter under a force of 60 g followed by immersion of the silicon wafer in acetone for 2 minutes.

The surface of the silicon wafer after the above described treatment was examined with AFM to find dots of about 10 nm diameter along the scratch line, each of which was supposedly a molecule of the polymer adhering to the substrate surface.

What is claimed is:

1. A method for patterning of a film of a polymeric resin formed on the surface of a substrate which comprises the steps of:

(a) forming, on the surface of a substrate, a thin film of an organic polymeric resin soluble in an organic solvent;

(b) applying a pressure in the range from 0.01 GPa to 30 GPa pattern-wise to the film of the organic polymeric resin on the substrate surface so as to enhance adhesion of the organic polymeric resin to the substrate surface on the pattern-wise areas; and (c) selectively dissolving away, with the organic solvent, the organic polymeric resin of the film in the areas where the pressure is not applied in step (b).

2. The method for patterning of a film of a polymeric resin formed on the surface of a substrate as claimed in claim 1 in which the organic polymeric resin is a polymer consisting of the monomeric units expressed by the formula —($CH_2$—$CR^1R^2$)—, in which $R^1$ and $R^2$ are each an atom or group of the formula —H, —$CH_3$, —$C_6H_5$, —COOH, —$COOCH_3$, —$COONH_2$ or —$COCH_3$.

3. The method for patterning of a film of a polymeric resin formed on the surface of a substrate as claimed in claim 2 in which the organic polymeric resin is poly(methyl methacrylate) or polystyrene.

4. The method for patterning of a film of a polymeric resin formed on the surface of a substrate as claimed in claim 1 in which the pressure in step (b) is in the range from 1GPa to 20 GPa.

5. The method for patterning of a film of a polymeric resin formed on the surface of a substrate as claimed in claim 1 in which the film of an organic polymeric resin formed on the substrate surface has a thickness in the range from 10 nm to 100 nm.

6. A method for patterning of the surface of a substrate which comprises the steps of:

(a) forming, on the surface of the substrate, a thin film of an organic polymeric resin soluble in an organic solvent;

(b) applying a pressure in the range from 0.01 GPa to 30 GPa pattern-wise to the film of the organic polymeric resin on the substrate surface so as to enhance adhesion of the organic polymeric resin to the substrate surface on the pattern-wise areas;

(c) selectively dissolving away, with the organic solvent, the organic polymeric resin of the film in the areas where the pressure is not applied in step (b) to leave at least a part of the organic polymeric resin in the pattern-wise area; and (d) subjecting the surface of the substrate to an etching treatment, thereby etching the substrate selectively in the areas from where the polymeric resin is removed in step (c).

7. The method for patterning of the surface of a substrate as claimed in claim 6 in which the organic polymeric resin is a polymer consisting of the monomeric units expressed by the formula —(CH$_2$—CR$^1$R$^2$)—, in which R$^1$ and R$^2$ are each an atom or group of the formula —H, —CH$_3$, —C$_6$H$_5$, —COOH, —COOCH$_3$, —COONH$_2$ or —COCH$_3$.

8. The method for patterning of the surface of a substrate as claimed in claim 7 in which the organic polymeric resin is poly(methyl methacrylate) or polystyrene.

9. The method for patterning of the surface of a substrate as claimed in claim 6 in which the pressure in step (b) is in the range from 1 GPa to 20 GPa.

10. The method for patterning of the surface of a substrate as claimed in claim 6 in which the film of an organic polymeric resin formed on the substrate surface has a thickness in the range from 10 nm to 100 nm.

11. The method for patterning of the surface of a substrate as claimed in claim 6 in which the etching treatment in step (d) is performed in a dry-etching process.

12. The method for patterning of the surface of a substrate as claimed in claim 11 in which the etching treatment in a dry-etching process is performed with an electron-cyclotron resonance etching apparatus.

* * * * *